United States Patent
Salcedo et al.

(10) Patent No.: US 11,342,323 B2
(45) Date of Patent: May 24, 2022

(54) HIGH VOLTAGE TOLERANT CIRCUIT ARCHITECTURE FOR APPLICATIONS SUBJECT TO ELECTRICAL OVERSTRESS FAULT CONDITIONS

(71) Applicant: Analog Devices, Inc., Norwood, MA (US)

(72) Inventors: Javier A. Salcedo, North Billerica, MA (US); Linfeng He, Shenzhen (CN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/700,989

(22) Filed: Dec. 2, 2019

(65) Prior Publication Data
US 2020/0381417 A1    Dec. 3, 2020

Related U.S. Application Data

(60) Provisional application No. 62/854,793, filed on May 30, 2019.

(51) Int. Cl.
   *H01L 27/02*    (2006.01)
   *H02H 9/04*    (2006.01)
   (Continued)

(52) U.S. Cl.
   CPC ...... *H01L 27/0262* (2013.01); *H01L 29/0834* (2013.01); *H01L 29/0839* (2013.01);
   (Continued)

(58) Field of Classification Search
   CPC ............. H01L 27/0262; H01L 29/7408; H01L 29/0834; H01L 29/41716; H01L 29/402;
   (Continued)

(56) References Cited

U.S. PATENT DOCUMENTS 5,786,617 A * 7/1998 Merrill ................ H01L 27/0928
                                                          257/371
5,895,940 A    4/1999 Kim
                (Continued)

FOREIGN PATENT DOCUMENTS

CN    104269402 B    5/2017
CN    109713916 A    5/2019
                (Continued)

OTHER PUBLICATIONS

Dai et al., "ESD Protection Design with Stacked High-Holding-Voltage SCR for High-Voltage Pins in a Battery-Monitoring IC," in IEEE Transactions on Electron Devices, vol. 63, No. 5, pp. 1996-2002, May 2016, in 7 pages.

(Continued)

*Primary Examiner* — Bitew A Dinke
(74) *Attorney, Agent, or Firm* — Knobbe, Martens, Olson & Bear, LLP

(57) ABSTRACT

A semiconductor die with high-voltage tolerant electrical overstress circuit architecture is disclosed. One embodiment of the semiconductor die includes a signal pad, a ground pad, a core circuit electrically connected to the signal pad, and a stacked thyristor protection device. The stacked thyristor includes a first thyristor and a resistive thyristor electrically connected in a stack between the signal pad and the ground pad, which enhances the holding voltage of the circuit relatively to an implementation with only the thyristor. Further, the resistive thyristor includes a PNP bipolar transistor and a NPN bipolar transistor that are cross-coupled, and an electrical connection between a collector of the PNP bipolar transistor and a collector of the NPN bipolar transistor. This allows the resistive thyristor to exhibit both thyristor characteristics and resistive characteristics based on a level of current flow.

20 Claims, 11 Drawing Sheets

(51) Int. Cl.
*H01L 29/74* (2006.01)
*H01L 29/08* (2006.01)
*H01L 29/417* (2006.01)
*H01L 29/40* (2006.01)

(52) U.S. Cl.
CPC ...... *H01L 29/402* (2013.01); *H01L 29/41716* (2013.01); *H01L 29/7408* (2013.01); *H02H 9/046* (2013.01)

(58) Field of Classification Search
CPC ................ H01L 29/0839; H01L 29/74; H01L 2924/13035; H02H 9/046
See application file for complete search history.

(56) References Cited

U.S. PATENT DOCUMENTS

| | | | |
|---|---|---|---|
| 6,016,002 | A | 1/2000 | Chen et al. |
| 6,594,132 | B1 | 7/2003 | Avery |
| 6,713,818 | B2 | 3/2004 | Kodama |
| 6,768,616 | B2 | 7/2004 | Mergens et al. |
| 6,894,321 | B2 | 5/2005 | Morishita |
| 7,064,393 | B2 | 6/2006 | Mergens et al. |
| 7,274,047 | B2 | 9/2007 | Russ et al. |
| 7,773,356 | B2 | 8/2010 | Ryu et al. |
| 8,120,887 | B2 | 2/2012 | Mallikararjunaswamy et al. |
| 8,405,943 | B2* | 3/2013 | Song .................. H01L 27/0262 361/56 |
| 8,503,140 | B2 | 8/2013 | Abou-khalil et al. |
| 8,665,571 | B2 | 3/2014 | Salcedo et al. |
| 8,755,156 | B2 | 6/2014 | Tailliet |
| 8,772,091 | B2 | 7/2014 | Salcedo et al. |
| 8,860,080 | B2 | 10/2014 | Salcedo |
| 9,576,945 | B2 | 2/2017 | Lee et al. |
| 9,741,704 | B2 | 8/2017 | Chang et al. |
| 9,871,373 | B2 | 1/2018 | O'Donnell et al. |
| 9,929,142 | B2 | 3/2018 | Ivanov et al. |
| 9,954,356 | B2 | 4/2018 | Parthasarathy et al. |
| 10,008,490 | B2 | 6/2018 | Salcedo et al. |
| 10,020,299 | B2 | 7/2018 | Lai |
| 10,079,227 | B2 | 9/2018 | Xiu et al. |
| 10,134,724 | B2 | 11/2018 | Lee |
| 10,177,566 | B2 | 1/2019 | Zhao et al. |
| 10,249,609 | B2* | 4/2019 | Salcedo .............. H01L 27/0262 |
| 10,700,056 | B2* | 6/2020 | Zhao .................. H01L 29/0834 |
| 2009/0244797 | A1 | 10/2009 | Sawahata |
| 2009/0273876 | A1* | 11/2009 | Liu .................... H01L 27/0262 361/118 |
| 2010/0090283 | A1* | 4/2010 | Langguth ............ H01L 29/7436 257/355 |
| 2012/0293904 | A1* | 11/2012 | Salcedo ................ H02H 9/046 361/111 |
| 2014/0138740 | A1 | 5/2014 | Hu et al. |
| 2014/0167106 | A1* | 6/2014 | Salcedo .................. H01L 29/78 257/146 |
| 2014/0339601 | A1* | 11/2014 | Salcedo .............. H01L 29/7436 257/140 |
| 2015/0236011 | A1 | 8/2015 | Wang et al. |
| 2016/0300830 | A1* | 10/2016 | Salcedo .............. H01L 27/0259 |
| 2016/0329094 | A1 | 11/2016 | Luan et al. |
| 2017/0194315 | A1* | 7/2017 | Huang .............. H01L 29/42372 |
| 2017/0221876 | A1* | 8/2017 | Huang ................ H01L 29/0649 |
| 2017/0317070 | A1* | 11/2017 | Salcedo .................. H01L 24/49 |
| 2018/0088155 | A1 | 3/2018 | Clarke et al. |
| 2018/0226788 | A1* | 8/2018 | Salcedo .............. H01L 27/0921 |
| 2018/0308846 | A1* | 10/2018 | Huang .............. H01L 27/0262 |
| 2019/0051646 | A1* | 2/2019 | Salcedo .............. H01L 27/0288 |
| 2019/0128939 | A1 | 5/2019 | O'Donnell et al. |
| 2019/0131787 | A1 | 5/2019 | He et al. |
| 2020/0066709 | A1* | 2/2020 | Chen ........................ G05F 1/10 |
| 2020/0152578 | A1* | 5/2020 | Gifford .............. H01L 27/0928 |
| 2020/0342070 | A1* | 10/2020 | Parris .................... G06F 30/398 |
| 2021/0098614 | A1 | 4/2021 | Salcedo et al. |

FOREIGN PATENT DOCUMENTS

| | | |
|---|---|---|
| EP | 2806462 A1 | 11/2014 |
| KR | 101489328 B1 | 2/2015 |
| WO | WO 2010/029672 A1 | 3/2010 |

OTHER PUBLICATIONS

Do et al. "A Silicon Controlled Rectifier-Based ESD Protection Circuit with High Holding Voltage and High Robustness Characteristics" International Journal of Electrical, Computer, Energetic, Electronic and Communication Engineering vol. 12, No. 3 dated 2018, in 4 pages. dated 2018.

Kim et al. "SCR-Stacking Structure with High Holding Voltage for I/O and Power Clamp" International Journal of Electrical, Computer, Energetic, Electronic and Communication Engineering vol. 9, No. 6 dated 2015, in 4 pages.

Liu et al., "Silicon-Controlled Rectifier Stacking Structure for High-Voltage ESD Protection Applications," in IEEE Electron Device Letters, vol. 31, No. 8, pp. 845-847, Aug. 2010, in 3 pages.

Salcedo et al., "Bidirectional Devices for Automotive-Grade Electrostatic Discharge Applications," in IEEE Electron Device Letters, vol. 33, No. 6, pp. 860-862, Jun. 2012, in 3 pages.

* cited by examiner

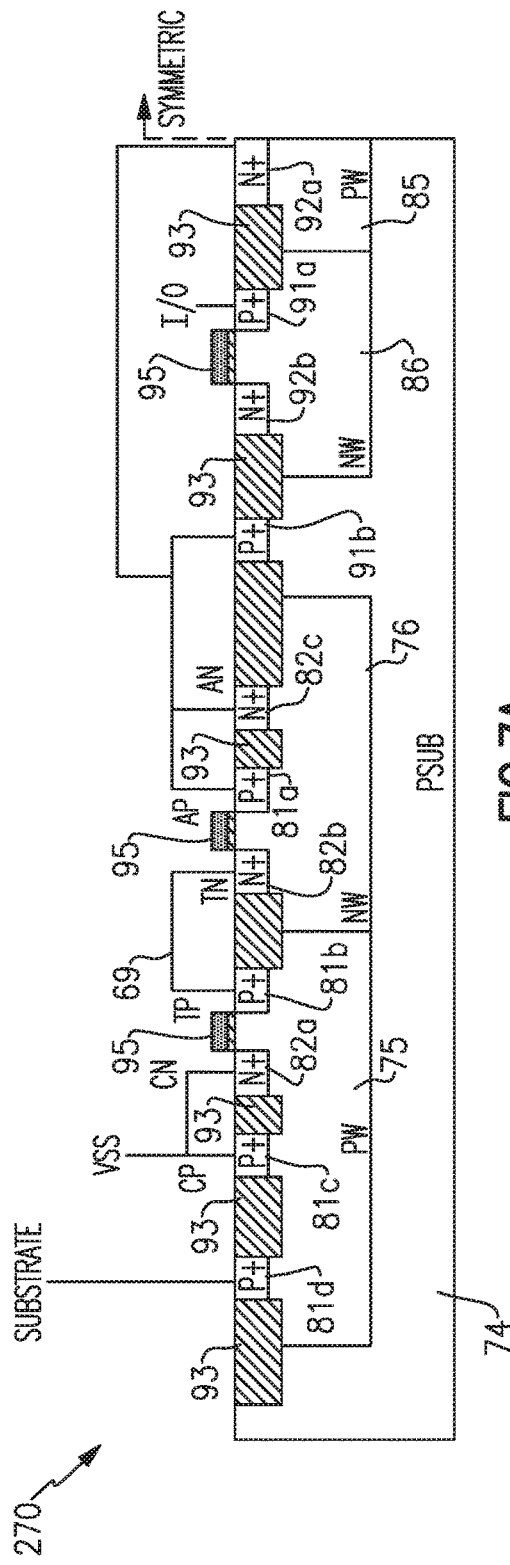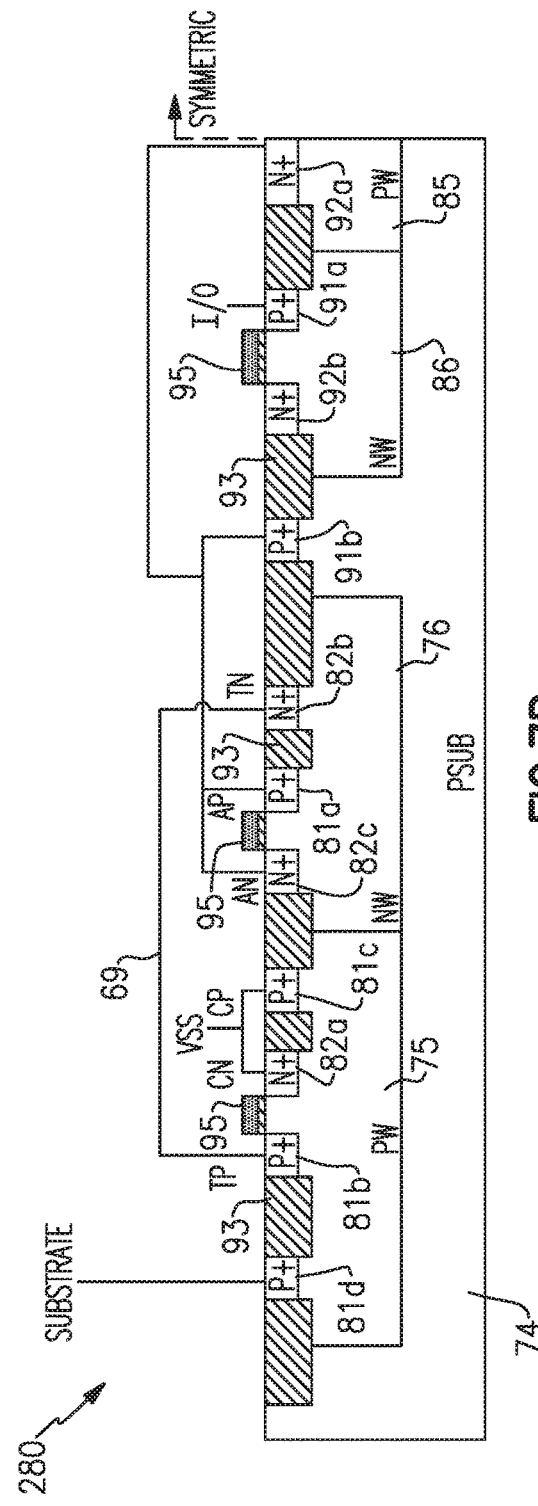

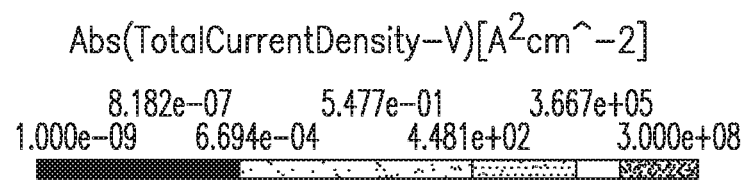
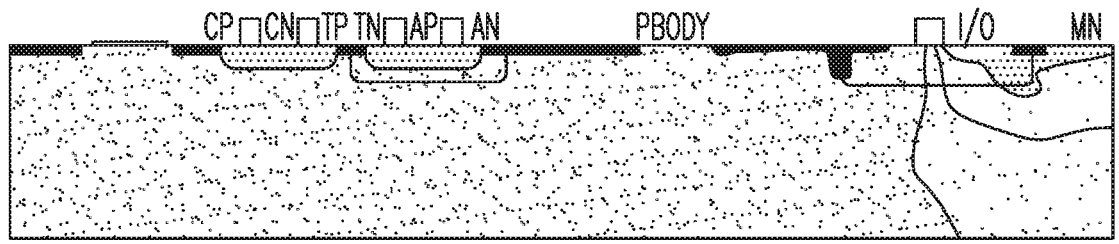
FIG.8A
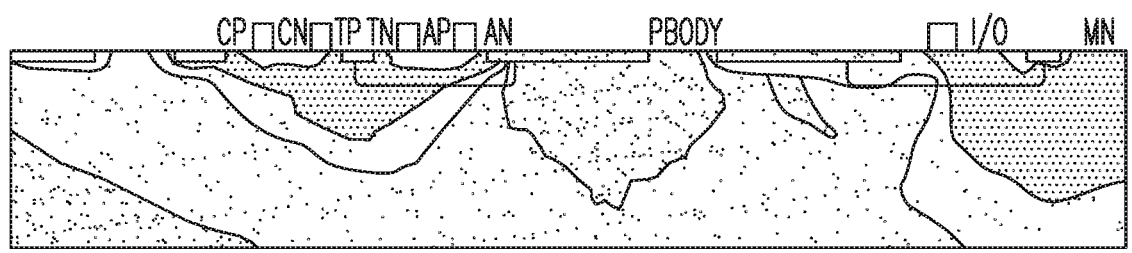
FIG.8B
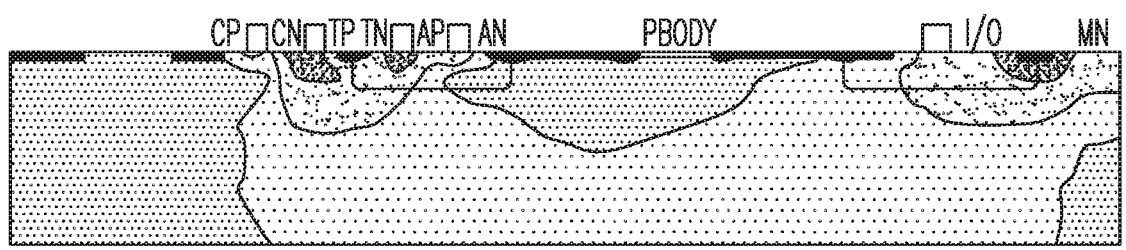
FIG.8C

HIGH VOLTAGE TOLERANT CIRCUIT ARCHITECTURE FOR APPLICATIONS SUBJECT TO ELECTRICAL OVERSTRESS FAULT CONDITIONS

CROSS-REFERENCE TO RELATED APPLICATIONS

The present application claims priority to U.S. Provisional Patent Application No. 62/854,793, filed May 30, 2019, and titled "HIGH VOLTAGE TOLERANT CIRCUIT ARCHITECTURE FOR APPLICATIONS SUBJECT TO ELECTRICAL OVERSTRESS FAULT CONDITIONS," the entirety of which is hereby incorporated herein by reference.

FIELD OF THE DISCLOSURE

Embodiments of the invention relate to electronic systems, and more particularly, to high voltage tolerant circuit architectures implemented in low voltage technologies and subject to system-level electromagnetic compatibility (EMC) fault conditions.

BACKGROUND

Certain electronic systems can be exposed to electrical overstress events, or electrical signals of short duration having rapidly changing voltage and high power. Electrical overstress events include, for example, electrical overstress (EOS) and electrostatic discharge (ESD) arising from the abrupt release of charge from an object or person to an electronic system. Moreover, electrical overstress events includes EMC fault conditions arising from operation of one piece of electronic equipment adversely affecting operation of another.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY

High voltage tolerance circuit architectures for applications subject to EMC fault conditions are disclosed. In certain implementations herein, a semiconductor die includes a signal pad, a ground pad, a core circuit electrically connected to the signal pad, and a stacked thyristor protection device for protecting the core circuit from electrical overstress. The stacked thyristor includes a first thyristor and a resistive thyristor electrically connected in a stack between the signal pad and the ground pad, which enhances the holding voltage of the circuit relatively to only the thyristor. The resistive thyristor includes a PNP bipolar transistor and an NPN bipolar transistor that are cross-coupled, and an electrical connection between a collector of the PNP bipolar transistor and a collector of the NPN bipolar transistor. Connecting the collectors of the bipolar transistors in this manner allows the resistive thyristor to exhibit both thyristor characteristics and resistive characteristics based on a level of current flow. Moreover, by including the resistive thyristor in the stacked thyristor protection structure, the holding voltage of the stacked thyristor protection structure is enhanced relative to an implementation in which only a thyristor is included. Furthermore, the enhancement in holding voltage can be realized with little to no impact on trigger voltage.

In one aspect, the semiconductor die includes a first pad, a second pad, a core circuit, and a stacked thyristor protection device. The core circuit electrically connects to the first pad. The stacked thyristor protection device is configured to protect the core circuit from electrical overstress, and includes a first thyristor and a resistive thyristor connected in a stack between the first pad and the second pad. The resistive thyristor within the stacked thyristor protection device includes a PNP bipolar transistor and a NPN bipolar transistor that are cross-coupled, and an electrical connection between a collector of the PNP bipolar transistor and a collector of the NPN bipolar transistor. This implementation results in a semiconductor die with high-voltage tolerance and high current handling capability.

In another aspect, the resistive thyristor includes an anode terminal, a cathode terminal, an n-type semiconductor well region (NW), and a p-type semiconductor well region (PW). The NW is configured to operate as a base of a PNP bipolar transistor and includes a p-type active (P+) anode region. The P+ anode region is connected to the anode terminal and configured to operate as an emitter of the PNP bipolar transistor, an n-type active (N+) anode region connected to the anode terminal, and an N+ bypass region. The PW is configured to operate as a base of an NPN bipolar transistor that is cross-coupled to the PNP bipolar transistor. The PW includes an N+ cathode region, which is connected to the cathode terminal and configured to operate as an emitter of the NPN bipolar transistor, a P+ cathode terminal connected to the cathode terminal, and a P+ bypass region. A metal conductor connects the P+ bypass region to the N+ bypass region such that a collector of the PNP bipolar transistor is connected to a collector of the NPN bipolar transistor.

In yet another aspect, the stacked thyristor protection device protects a high data rate interface. The stacked thyristor protection device includes a thyristor with an anode and a cathode, as well as a resistive thyristory with an anode and a cathode. The anode of the resistive thyristor electrically connects to the cathode of the thyristor. The resistive thyristor includes a PNP bipolar transistor and a NPN bipolar transistor that are cross-coupled. The resistive thyristor further includes an electrical connection between a collector of the PNP bipolar transistor and a collector of the NPN bipolar transistor.

BRIEF DESCRIPTION OF THE DRAWINGS

FIG. 7A is a schematic diagram of a cross section of a stacked thyristor protection device according to another embodiment.

FIG. 7B is a schematic diagram of a cross section of a stacked thyristor protection device according to another embodiment.

FIG. 8A is one example of the simulated current distribution of a stacked thyristor protection device at low current density.

FIG. 8B is one example of the simulated current distribution of a stacked thyristor protection device at medium current density.

FIG. 8C is one example of the simulated current distribution of a stacked thyristor protection device at high current density.

DETAILED DESCRIPTION OF THE PREFERRED EMBODIMENT

Figure 1:
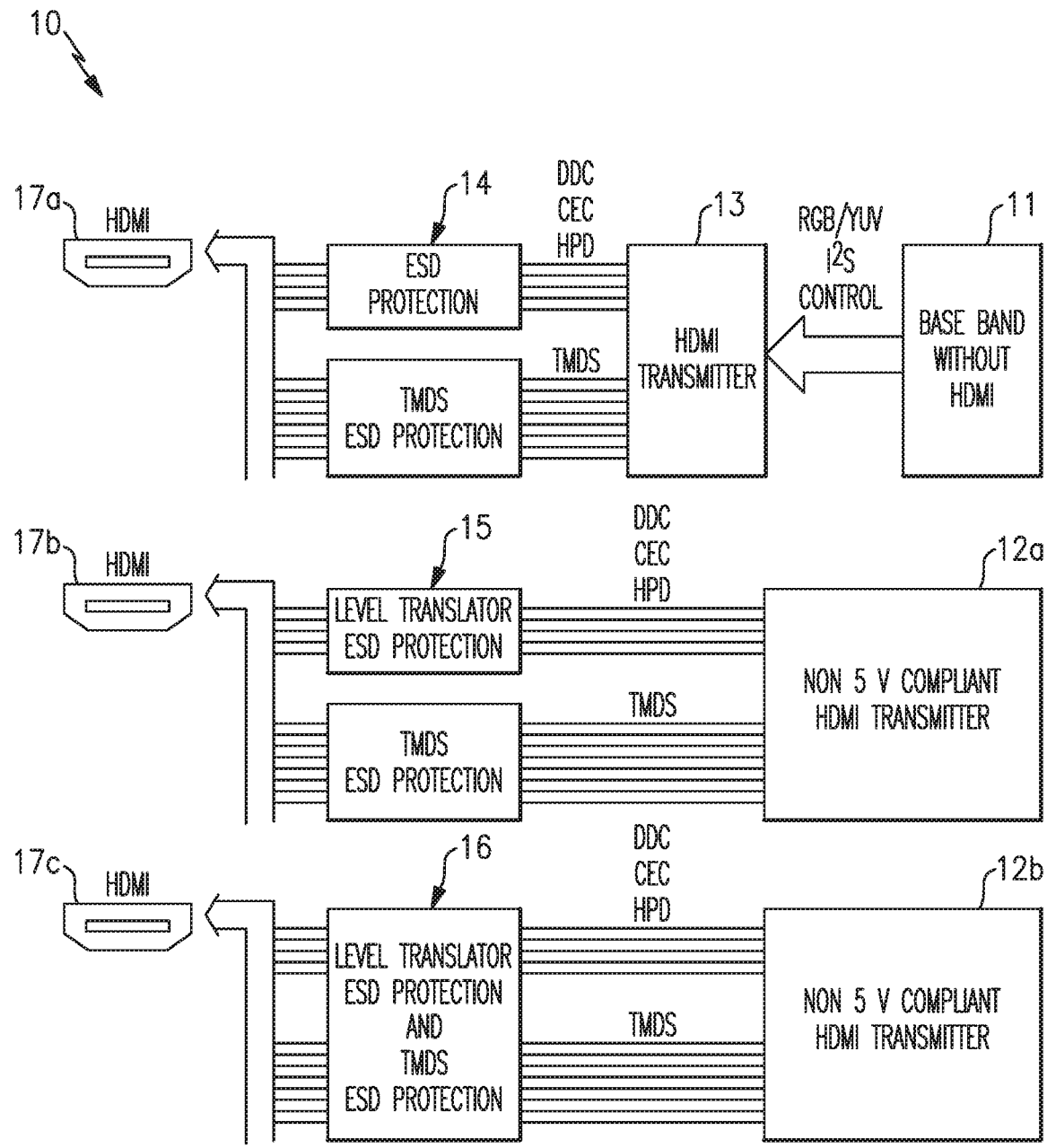
FIG. 1 is a schematic diagram of multifunction high definition multimedia interface (HIM) protection schemes according to various embodiments.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that the elements illustrated in the figures are not necessarily, drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from electrical overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (TEC), and the Automotive Engineering Council (AEC). The standards can cover a wide multitude of electrical overstress events, including electrical overstress (EOS), electrostatic discharge (ESD), and/or electromagnetic compatibility (EMC) fault conditions.

FIG. 1 is a schematic diagram of high definition multimedia interface (HDMI) protection schemes 10 according to various embodiments. The diagram depicts various ESD protection scenarios for HDMI use cases.

HDMI specifications have evolved over the years to support new applications. For example, HDMI 2.1 supports a range of high video resolutions and refresh rates, including 8K resolution at 60 Hz, 4K resolution at 1.20 Hz, and resolutions in general up to 10K. Moreover, HDMI 2.1 supports various high dynamic range (HDR) formats, such as dynamic HDR and uncompressed 8K resolution video with HDR. Furthermore, bandwidth capability is increased up to 48 Gbps.

Ultra High Speed HDMI applications allow for Auto Low Latency Mode (ALLM), Enhanced Audio Return Channel (eARC), Quick Frame Transport (QFT), Quick Media Switching (QMS), Variable Refresh Rate (VRR), and/or low EMI (electro-magnetic interference) for reducing interference with nearby wireless devices.

In high data rate applications, such as HDMI 2.1, the performance of core circuitry connected to an interface is impacted by loading effects (including, but not limited to, parasitic capacitance and/or leakage current) of electrical overstress protection circuitry connected to the interface. In such applications, it may not be feasible to overdesign the electrical overstress protection circuitry.

For example, in the context of supporting 48 Gbps bandwidth HDMI 2.1, a protection device can be specified to have low loading while at the same time handling high stress conditions at the interface, for instance, overstress greater than 3.3V in a low voltage 1.8V complementary metal oxide semiconductor (CMOS) process.

Providing suitable electrical overstress protection circuitry is further complicated by issues of backward compatibility. For example, HDMI 2.1 specifies backward compatibility for an existing base of HDMI devices operating at higher supply voltage levels, resulting in challenging-high voltage tolerant conditions when the interface is connected to a legacy HDMI device.

In FIG. 1, a first usage scenario is depicted in which a base band system 11 without HDMI is coupled to an HDMI transmitter 13, which in turn is connected to an HDMI interface 17a. The HDMI transmitter 13 transmits over the HDMI interface 17a using a variety of channels, including an audio/video channel using transition-minimized differential signaling (TMDS), as well as a display data channel (DDC) carrying consumer electronics control (CEC) signals. The illustrated. HDMI interface 17a also operates with hotplug detection (HPD). The HDMI transmitter 13 is protected by protection circuitry 14 including ESD protection circuitry for DDC, CEC, and/or HPD as well as TMDS ESD protection circuitry for the TMDS audio/video channel.

With continuing reference to FIG. 1, a second usage scenario is depicted in which a non 5 volt compliant HDMI transmitter 12a is connected to an HDMI interface 17b. As shown in FIG. 1, the non 5 volt compliant HDMI transmitter 12a is protected by protection circuitry 15 including level translator ESD protection circuitry for DDC, CEC, and/or HPD as well as TMDS ESD protection circuitry for the TMDS audio/video channel.

As further shown in FIG. 1, a third usage scenario is depicted in which a non 5 volt compliant HDMI transmitter 12b is connected to an HDMI interface 17c and protected by integrated protection circuitry 16 providing both level translator ESD protection and TMDS ESD protection.

Although various HDMI protection scenarios have been depicted, HDMI interfaces can be protected in a wide variety of ways.

Figure 2A:
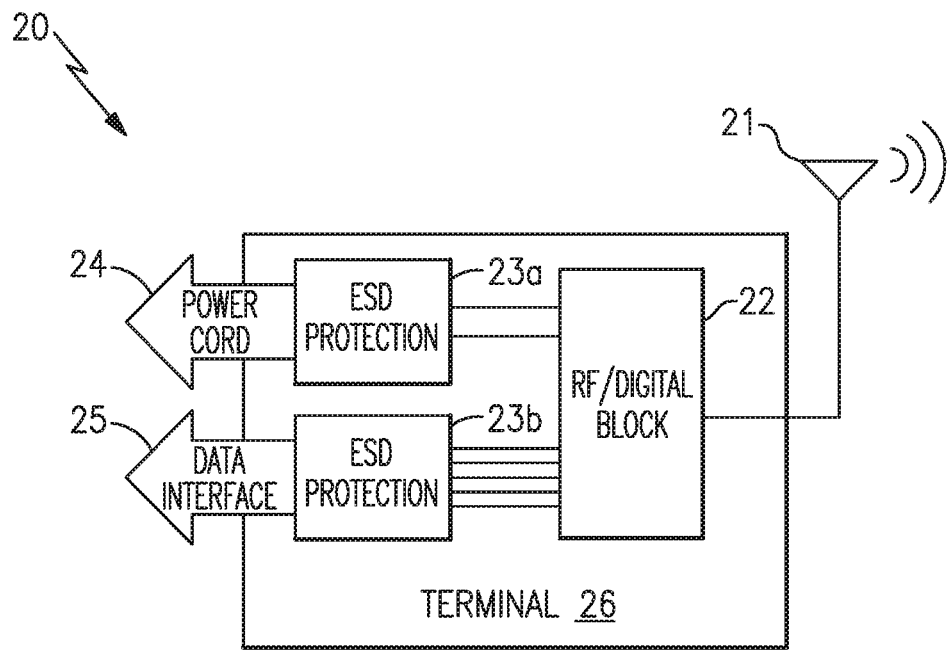
FIG. 2A is a schematic diagram of a mobile terminal according to one embodiment.

FIG. 2A is a schematic diagram of a mobile terminal 26 according to one embodiment. The mobile terminal 26 includes an antenna 21, an RF front end/digital block 22, a first ESD protection circuit 23a for a power cord 24, and a second ESD protection circuit 23b for a data interface 25.

The mobile terminal 26 illustrates another example of a communication system 20 that can suffer from constraints in electrical overstress protection of a high speed interface. For example, the mobile terminal 26 can include a digital processor or block (for instance, the RF front end/digital block 22) that processes a high speed stream of digital data (for instance, the data interface 25) associated with signals wirelessly transmitted and received by the mobile terminal 26.

Figure 2B:
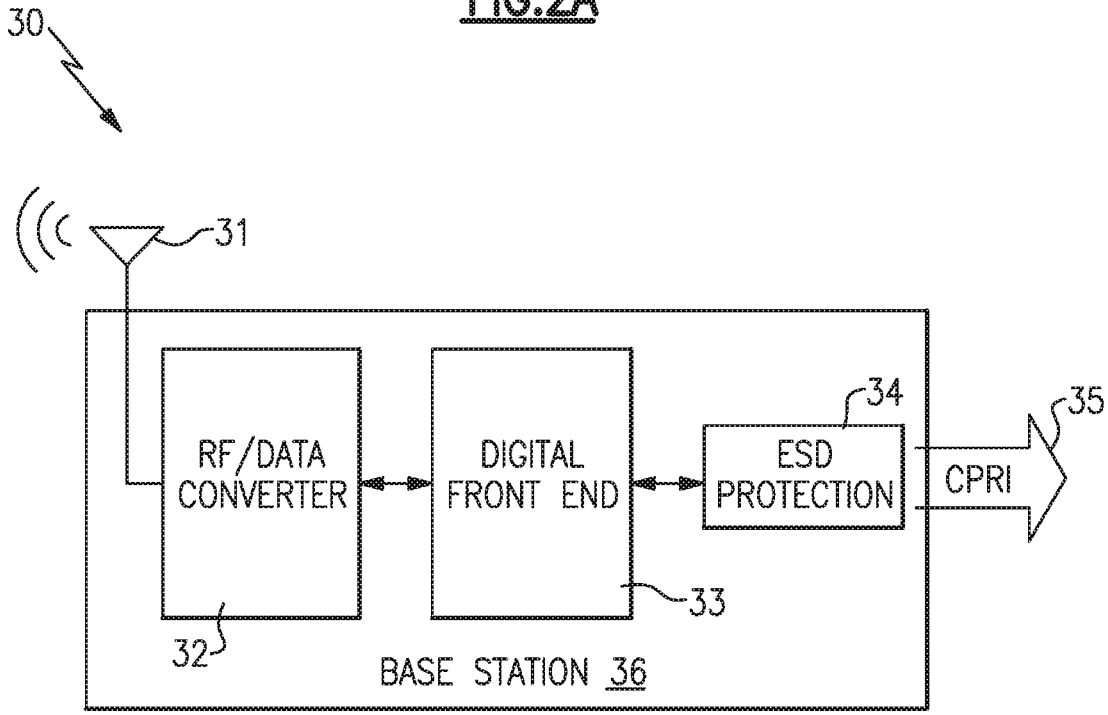
FIG. 2B is a schematic diagram of a base station according to one embodiment.

FIG. 2B is a schematic diagram of a base station 36 according to one embodiment. The base station 36 includes an antenna 31, an RF front end/data converter 32, a digital front end 33, and an ESI) protection circuit 34 for a common public radio interface (CPRI) 35.

The base station 36 illustrates another example of a communication system 30 that can suffer from constraints in electrical overstress protection of a high speed interface.

With reference to FIGS. 2A and 2B, a wireless network, such as a fifth generation (5G) cellular network, can include mobile terminals and base stations that operate with high data rates to enable wide bandwidth to support emerging use cases and applications. High speed signaling pins of semiconductor chips used in such systems are sensitive to loading effects and/or operating characteristics of electrical overstress protection circuitry used to protect core circuitry of the semiconductor chips from damage.

Overview of Slacked Thyristor Protection Devices for High Data Rate Interfaces

In certain embodiments herein, a stacked thyristor protection device provides electrical overstress protection to a high-speed interface of a semiconductor die. The stacked thyristor protection device includes a thyristor and a resistive thyristor electrically connected in a stack between a first pad and a second pad of the semiconductor die. For example, the first pad can correspond to a signal pad of the high speed interface, while the second pad can correspond to a ground pad. A thyristor is also referred to herein as a silicon-controlled rectifier (SCR), and a resistive thyristor is also referred to herein as a resistive silicon-controlled rectifier (RSCR).

By including the resistive thyristor in the stacked thyristor protection device, the holding voltage of the stacked thyristor protection device is enhanced relative to an implementation with only the thyristor is connected between the pads. Furthermore, the enhancement in holding voltage can be realized with little to no impact on trigger voltage. For example, in certain implementations, the stacked thyristor protection device operates with a trigger voltage about equal to a trigger voltage of the thyristor, while having a holding voltage about equal to a sum of a holding voltage of the thyristor and a holding voltage of the resistive thyristor.

The resistive thyristor includes a PNP bipolar transistor and an NPN bipolar transistor that are cross-coupled, with a base of the PNP bipolar transistor electrically, connected to a collector of the NPN bipolar transistor and with a base of the NPN bipolar transistor electrically connected to a collector of the PNP bipolar transistor. However, the resistive thyristor further includes a conductor (for instance, a connection in metallization) connected between the collector of the PNP bipolar transistor and the collector of the NPN bipolar transistor.

By including the conductor between the collectors of the transistors, the resistive thyristor behaves as a resistor at low current levels while still behaving as a thyristor at high current levels. Thus, the resistive thyristor exhibits both resistor characteristics and thyristor characteristics based on a level of current flow through the resistive thyristor.

For example, in certain implementations, a base of the PNP bipolar transistor is formed by an n-type semiconductor well (NW or n-well) and a base of the NPN bipolar transistor is formed by a p-type semiconductor well (PW or p-well). Additionally, at low current levels, a metal connection serves to bypass the semiconductor interface or p-n junction between the PW and the NW, and thus the resistive thyristor behaves as a resistor having a resistance based on a sum of a resistance of the NW and a resistance of the PW. However, at high current levels, the resistive thyristor operates with regenerative feedback and behaves as a thyristor.

Accordingly, the stacked arrangement of the thyristor and the resistive thyristor provides the benefit of high holding voltage. Furthermore, the stacked arrangement of the thyristor and resistive thyristor results in certain junction capacitances being in series between the pads, which leads to a reduction in capacitive loading.

Accordingly, stacked thyristor protection devices provide fast-transient current handling capability per unit area while exhibiting reduced parasitic capacitance. Such stacked thyristor protection devices are suitable for protection signal pads of high data rate communication interfaces, for instance, for a range of multiple end-markets of emerging applications, including integrating high voltage tolerant/ high data rate communication interfaces for automotive, industrial, and/or communication infrastructure.

The enhanced holding voltage of the stacked thyristor protection devices aids in handling higher operating voltage tolerant conditions, for instance, backward compatibility specifications for HDMI 2.1. For example, in such applications, high data rate communication at over 3.3 V is enabled without risk of electrically-induced physical damage arising from a predecessor HDMI device supplying a legacy operating voltage of higher level. Thus, the stacked thyristor protection devices can be implemented to operate with relatively high holding voltage, for instance, greater than 3.3 V holding voltage during stress conditions in normal operation, while preserving a low trigger voltage and device fast-transient current handling capability to over 2.5 amp (A) design target.

Accordingly, the benefits of feedback of a thyristor structure are provided while remaining at a high holding voltage condition (for instance, greater than 3.3V) during a high stress current conduction on-state.

In certain implementations, the layout for a stacked arrangement of the thyristor and the resistive thyristor further provides additional thyristor protection structures that activate to provide additional current paths at high current levels. For example, current handling capability can be increased and on-state resistance reduced by building multiple current conduction paths into the device architecture.

The stacked thyristor protection devices herein can be fabricated using a range of process technologies, including, but not limited to, sub-28 nm CMOS process technologies.

Figure 3A:
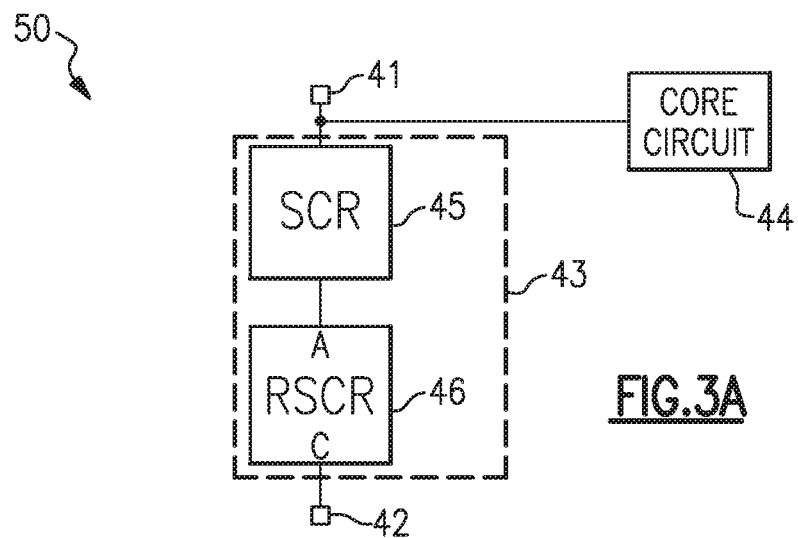
FIG. 3A is a schematic diagram of a chip interface according to one embodiment.

FIG. 3A is a schematic diagram of a chip interface 50 according to one embodiment. The chip interface 50 includes a first pin or pad 41, a second pad 42, a stacked thyristor protection device 43, and a core circuit 44. The chip interface 50 corresponds to a portion of an electrical interface for a semiconductor die or chip.

In certain implementations, the first pad 41 corresponds to a signal pad and the second pad 42 corresponds to a ground pad. For example, the first pad 41 can correspond to a high speed signal pin of a high performance signal interface, such as HDMI 2.1. The stacked thyristor protection device 43 provides electrical overstress protection to the core circuit 44, which can be, for example, a receiver, a transmitter, or a transceiver of the interface 50.

With continuing reference to FIG. 3A, the stacked thyristor protection device 43 transitions from an off or high impedance state to an on or low impedance state in response to a voltage difference between the first pad 41 and the second pad 42 reaching a trigger voltage of the stacked thyristor protection device 43. After turn on or activation, the stacked thyristor protection device 43 remains in the on state so long as the voltage difference between the first pad 41 and the second pad 42 is above a holding voltage of the stacked thyristor protection device 43.

In the illustrated embodiment, the stacked thyristor protection device includes a thyristor 45 and a resistive thyristor 46 electrically connected in a stack between the first pad 41 and the second pad 42. The thyristor 45 is also referred to herein as a silicon-controlled rectifier (SCR), and the resistive thyristor 46 is also referred to herein as a resistive silicon-controlled rectifier (RSCR).

By including the resistive thyristor 46 in the stacked thyristor protection device 43, the holding voltage of the stacked thyristor protection device 43 is enhanced relatively to an implementation with only the thyristor 45 connected between the first pad 41 and the second pad 42. In certain implementations, the stacked thyristor protection device 43 operates with a trigger voltage that is substantially equal to a trigger voltage of the thyristor 45, while having a holding voltage that is substantially equal to a sum of a holding voltage of the thyristor 45 and a holding voltage of the resistive thyristor 46.

Accordingly, the stacked arrangement of the thyristor 45 and the resistive thyristor 46 provides an enhancement to holding voltage. Furthermore, such a stacked arrangement provides a reduction in capacitive loading arising from a series arrangement of junction capacitances between the first pad 41 and the second pad 42.

Thus, the stacked thyristor protection device 43 is suitable for providing fast-transient current handling capability per unit area while exhibiting reduced parasitic capacitance. Such stacked thyristor protection devices are suitable for protection signal pads of high data rate communication. In one embodiment, the pad 41 is a signal pad of an HDMI 2.1 interface or other high data rate interface.

Figure 3B:
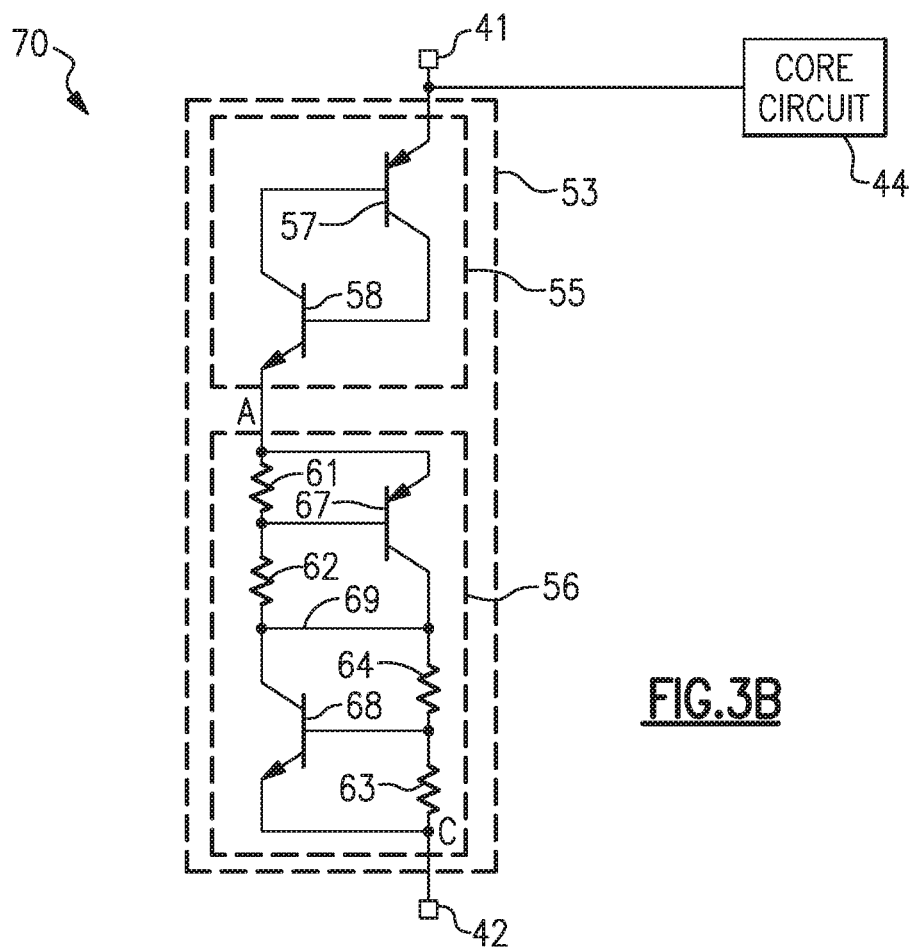
FIG. 3B is a schematic diagram of a chip interface according to another embodiment.

FIG. 3B is a schematic diagram of a chip interface 70 according to another embodiment. The chip interface 70 includes a first pad 41, a second pad 42, a stacked thyristor protection device 53, and a core circuit 44.

The chip interface 70 of FIG. 3B is similar to the chip interface 50 of FIG. 3A, except that the chip interface 70 illustrates a specific embodiment of a thyristor 55 and resistive thyristor 56.

As shown in FIG. 3B, the thyristor 55 includes a PNP bipolar transistor 57 and an NPN bipolar transistor 58 that are cross-coupled. Additionally, the resistive thyristor 56 includes a first resistor 61, a second resistor 62, a third resistor 63, a fourth resistor 64, a PNP bipolar transistor 67, and an NPN bipolar transistor 68.

In the illustrated embodiment, the first resistor 61 is electrically connected across a base-to-emitter junction of the PNP bipolar transistor 67, and the third resistor 63 is electrically connected across a base-to-emitter junction of the NPN bipolar transistor 68. Additionally, a base of the PNP bipolar transistor 67 is electrically connected to a collector of the NPN bipolar transistor 68 by way of the second resistor 62. Furthermore, a base of the NPN bipolar transistor 68 is electrically connected to a collector of the PNP bipolar transistor 67 by way of the fourth resistor 64.

Accordingly, the resistive thyristor 56 is implemented with cross-coupling between the PNP bipolar transistor 67 and the NPN bipolar transistor 68. Thus, regenerative feedback is provided when the resistive thyristor 56 is operating at high current levels.

However, the resistive thyristor 56 further includes an electrical connection 69 between the collector of the PNP bipolar transistor 67 and the collector of the NPN bipolar transistor 68. In certain implementations, the electrical connection 69 is implemented as metallization connecting an n-type semiconductor collector region of the NPN bipolar transistor 67 to a p-type semiconductor collector region of the PNP bipolar transistor 68.

By including the electrical connection 69 between the collectors of the transistors, the resistive thyristor 56 behaves as a thyristor at high current levels and as a resistor at low current levels. Thus, the resistive thyristor 56 exhibits both thyristor characteristics and resistive characteristics based on a level of current flow.

Figure 4:
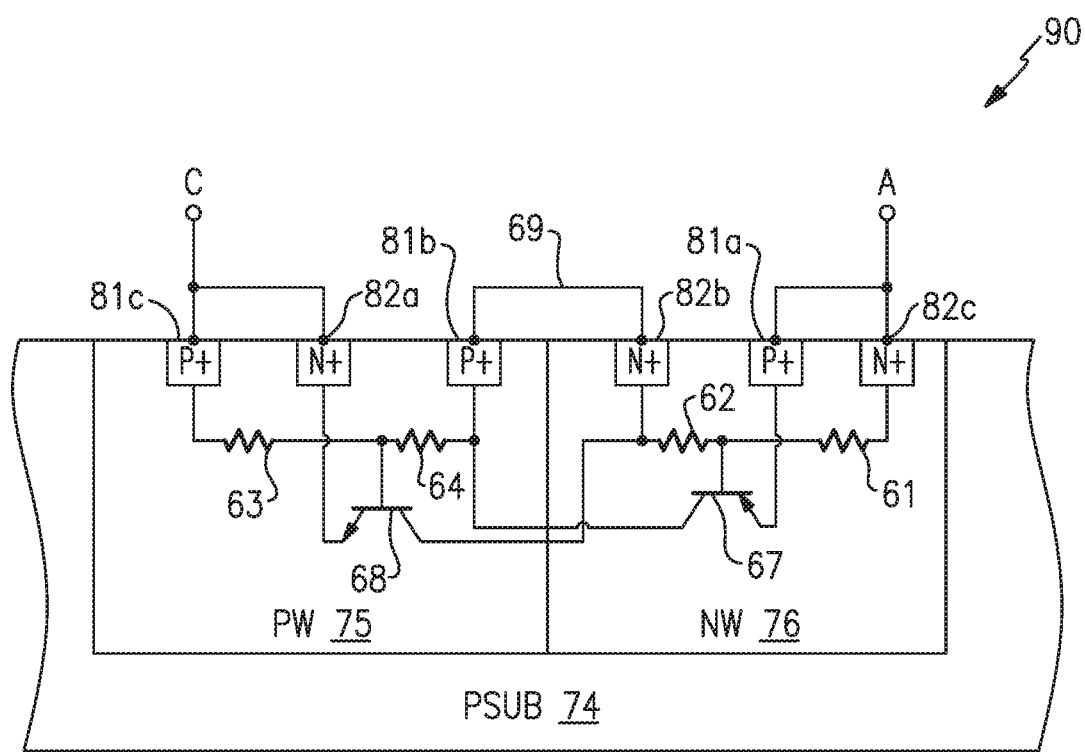
FIG. 4 is a schematic diagram of a cross section of a resistive thyristor according to one embodiment.

FIG. 4 is a schematic diagram of a cross section of a resistive thyristor 90 according to one embodiment. The resistive thyristor 90 illustrates one embodiment of the resistive thyristor 56 of FIG. 3B. In FIG. 4, a cross section of the resistive thyristor 90 is depicted. When viewed from above, the resistive thyristor 90 can have a layout implemented in a wide variety of ways, such as a planar layout configuration or annular configuration.

In the illustrated embodiment, the resistive thyristor 90 is formed directly, in a p-type substrate (PSUB) 74. However, the teachings herein are applicable to other configurations, such as implementations in which a substrate includes a p-type epitaxial layer over a doped or undoped support substrate, and the resistive thyristor 90 is fabricated in the p-type epitaxial layer. Although not illustrated in FIG. 4, the PSUB 74 typically includes other devices or structures formed therein. For example, the resistive thyristor 90 can be fabricated along with core circuitry and other protection devices in a common substrate.

The resistive thyristor 90 includes a p-type well region (PW) 75 and an n-type semiconductor well region (NW) 76 formed in the PSUB 74. Additionally, various p-type active (P+) regions and n-type active (N+) regions have been depicted. The P+ regions have a higher doping concentration than the PW, which in turn have a higher doping concentration than the PSUB 74. Additionally, the N+ regions have a higher doping concentration than the NW. Persons having ordinary skill in the art will appreciate various concentrations of dopants in the regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

Although electrical connections are illustrated schematically using lines over the PSUB 74, persons having ordinary skill in the art will appreciate that the annotated electrical connections can be made in part using metallization via back-end processing. Moreover, in certain implementations, bond pads or other structures can be included. Such details are omitted for clarity of the figures.

The resistive thyristor 90 has been schematically annotated to show certain electrical connections and devices, including a first resistor 61, a second resistor 62, a third resistor 63, a fourth resistor 64, a PNP bipolar transistor 67, an NPN bipolar transistor 68, and a metal conductor 69.

The PNP bipolar transistor 67 includes an emitter associated with P+ region 81a, a base associated with NW 76 and N+ region 82c, and a collector associated with PW 75 and P+ region 81b. Additionally, the NPN bipolar transistor 68 includes an emitter associated with N+ region 82a, a base associated with PW 75 and P+ region 811c, and a collector associated with NW 76 and N+ region 82b. Furthermore, the first resistor 61 and the second resistor 62 are associated with a resistance of the NW 76, while the third resistor 63 and the fourth resistor 64 are associated with a resistance of the PW 75.

As shown in FIG. 4, a first piece of metallization or metal conductor 69 is used to connect the P+ region 81b in the PW 75 to the N+ region 82b in the NW 76. Additionally, a second piece of metallization is uses to connect the P+ region 81a and the N+ region 82c in the NW 76 to an anode terminal (A). Furthermore, a third piece of metallization is used to connect the P+ region 81c and the N+ region 82a in the PW 75 to a cathode terminal (C). Such metallization can be made using metal layers and vias during backend processing.

The metal conductor 69 serves to bypass the semiconductor interface or p-n junction between the PW 75 and the NW 76. This in turn provides an electrical connection between the anode terminal (A) and the cathode terminal (C) through a series combination of the first resistor 61, the second resistor 62, the third resistor 63, and the fourth resistor 64.

In certain implementations, the path through the resistors 61-64 and conductor 69 is active when the p-n junction between the PW 75 and the NW 76 is blocking, and thus the resistive thyristor 90 behaves as a resistor at low current levels. However, at high current levels the bipolar transistors provide regenerative feedback such that the resistive thyristor 90 behaves as a thyristor.

Figure 5:
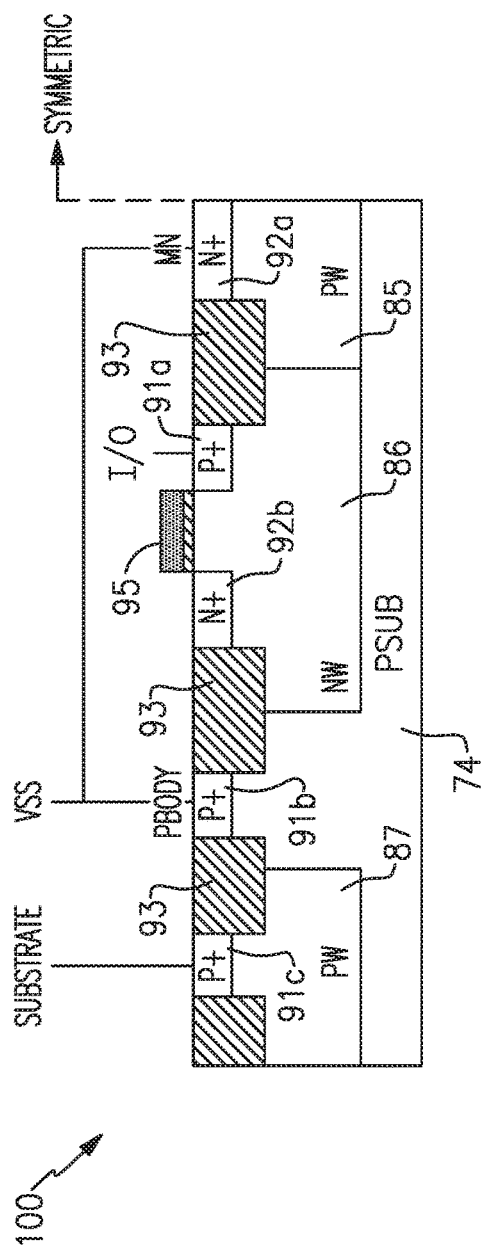
FIG. 5 is a schematic diagram of a cross section of a thyristor according to one embodiment.

FIG. 5 is a schematic diagram of a cross section of a thyristor 100 according to one embodiment. In FIG. 5, a left half of the thyristor 100 is depicted. However, the thyristor 100 is implemented to be substantially symmetric with respect to a right edge of the diagram such that the thyristor 100 includes a corresponding right half.

As shown in FIG. 5, the thyristor 100 includes a P+ region 91a formed in an NW 86 and connected to an I/O pad. Additionally, the thyristor 100 includes an N+ region 92a formed in a PW 85 and connected to a ground or VSS pad at node MN. The P+ region 91a, NW 86, PW 85, and N+ region 92a form a PNPN structure that provides thyristor operation.

The VSS pad also connects to a P+ region 91b in the PSUB 74 at node Pbody. Thus, the PW 85 is grounded through node PBody to the VSS pad.

As shown in FIG. 5, a PW guard ring 87 is included. When viewed from above, the PW guard ring 87 can surround a perimeter of the thyristor TOO. The PW guard ring 87 is connected to a substrate ground voltage by way of the P+ region 91c. In certain implementations, the substrate ground voltage is connected to a substrate ground pad that is connected to the VSS pad off chip. Thus, the substrate ground pad and the VSS pad can be isolated on-chip and connected off-chip, thereby providing enhanced immunity against latch-up.

The thyristor 100 further includes additional structures, including isolation regions 93 (for instance, shallow trench isolation regions) between active regions. The isolation regions 93 can be formed in a variety of ways, such as etching trenches in the PSUB 74, filling the trenches with a dielectric, such as silicon dioxide (Sift), and removing the excess dielectric using any suitable method, such as chemical-mechanical planarization.

The thyristor 100 also includes a field plate or gate structure 95 formed between the P+ region 91a and the N+ region 92b. Including the field plate structure 95 provides increased control over low capacitance characteristics in the presence of process, temperature, and/or voltage (PVT) variation.

The thyristor 100 of FIG. 5 can serve in protecting certain interfaces. For example, the thyristor can provide rapid turn-on speed, robustness against breakdown, and a trigger voltage suitable for high voltage tolerant interfaces.

However, the thyristor 100 can have a relatively low holding voltage. Thus, using the thyristor 100 alone may not be suitable for applications with high current handling capability at full 3.3V. This poses a risk of electrical overstress-induced damaged in applications that are subject to electrical overstress during normal powered operation, such as HDMI (for example, FIG. 1) as well as other applications with exposed interfaces.

Figure 6A:
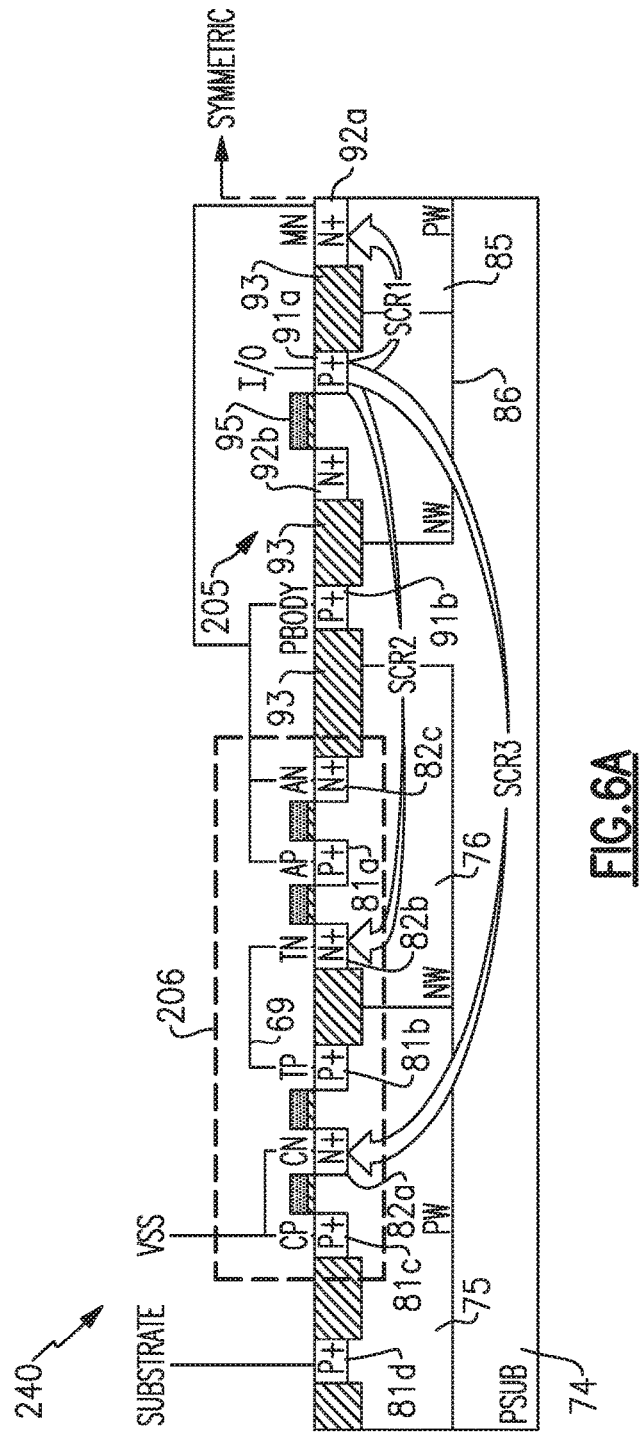
FIG. 6A is a schematic diagram of a cross section of a stacked thyristor protection device according to one embodiment.

FIG. 6A is a schematic diagram of a cross section of a stacked thyristor protection device 240 according to one embodiment. In FIG. 6A, a left half of the stacked thyristor protection device 240 is depicted. However, the stacked thyristor protection device 240 is implemented to be substantially symmetric with respect to a right edge of the diagram such that the stacked thyristor protection device 240 includes a corresponding right half.

The stacked thyristor protection device 240 includes a thyristor 205 and a resistive thyristor 206 electrically connected in a stack between an I/O pad and a VSS pad. In particular, the thyristor 205 and the resistive thyristor 206 are formed in a monolithic stacked thyristor structure in a common layout on the PSUB 74. The thyristor 205 is similar to the thyristor 100 of FIG. 5. Additionally, the resistive thyristor 206 is similar to the resistive thyristor 90 of FIG. 4 except that the resistive thyristor 206 further includes isolation regions 93 for enhanced isolation and field plate structures between active regions for enhanced control over low capacitance characteristics.

By stacking the thyristor 205 and the resistive thyristor 206, enhanced holding voltage is provided relative to the thyristor 100 of FIG. 5. Additionally, the stacked thyristor protection device 240 provides higher current handling capability and lower capacitance within comparable area. For example, in certain implementations, a PW guard ring is included around the stacked thyristor protection device 240, and a total area of the stacked thyristor protection device 240 from an outer perimeter of the PW guard ring is about the same as a total area of the thyristor 100 from an outer perimeter of the PW guard ring 74 of FIG. 5.

The resistive thyristor 206 has been annotated to include terminal labels AN, AP, TN, TP, CN, and CP corresponding to electrical terminals to N+ region 82c, P+ region 81a, N+ region 82b, P+ region 81b, N+ region 82a, and P+ region 81c, respectively. As shown in FIG. 6A, AN and TN also serve as body contacts to the NW 76, and TIP and CP also serve as body contacts to the PW 75. Furthermore, TP and TN are connected by metal conductor 69.

The thyristor 205 serves as a first thyristor structure (SCR1). Additionally, the resistive thyristor 206 serves as a resistive SCR (RSCR).

In addition to SCR1 and RSCR, additional thyristor structures are present in the stacked thyristor protection device 240, including a second thyristor (SCR2) and a third thyristor (SCR3). As shown in FIG. 6A, SCR2 is a PNPN structure associated with P+ region 91$a$, NW 86, PSUB 74, and NW 76/N+ region 82$b$. Additionally, SCR3 is a PNPN structure associated with P+ region 91$a$, NW 86, PSUB 74/PW 75, and N+ region 82$a$.

Figure 6B:
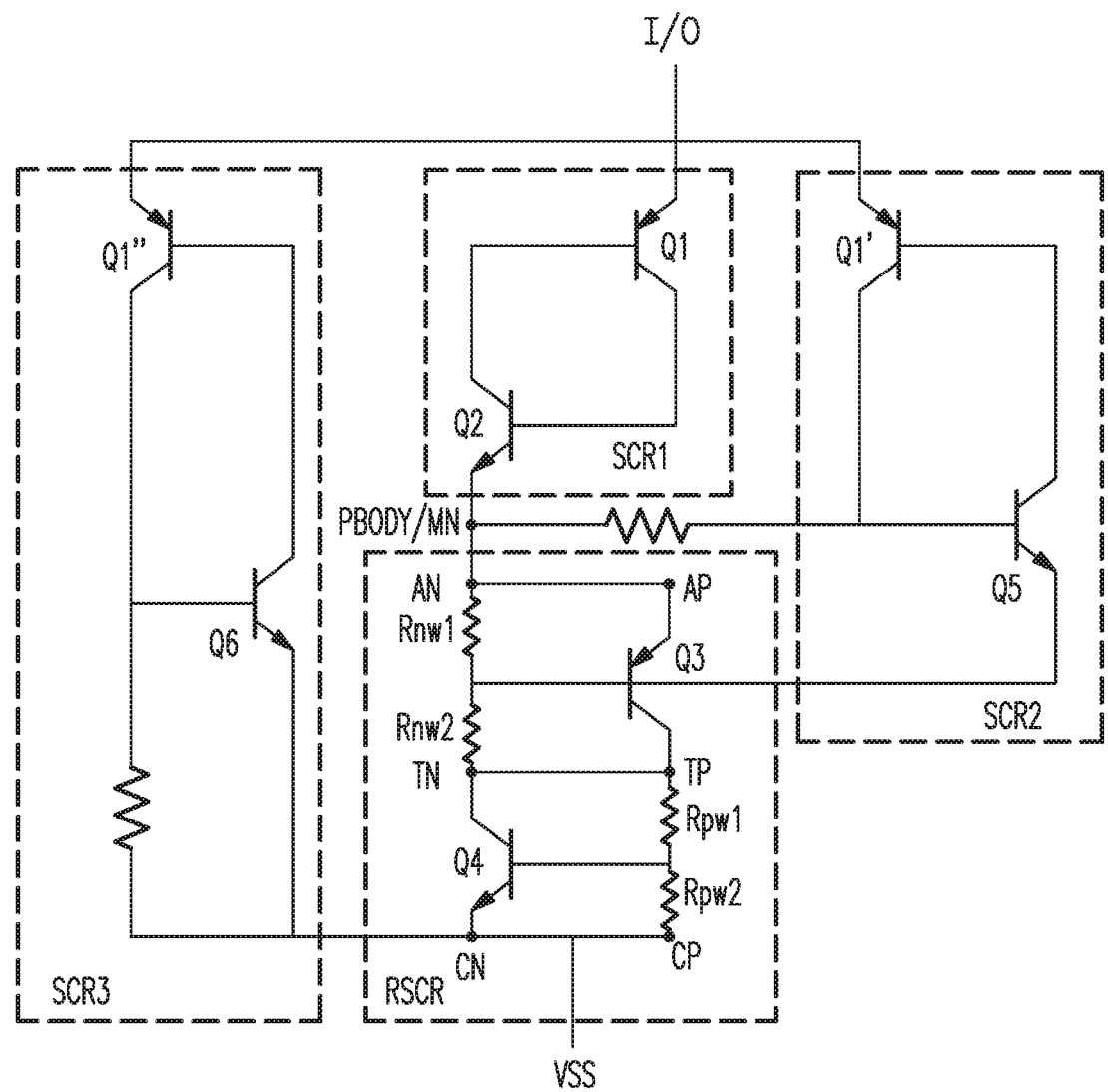
FIG. 6B is a circuit diagram of the stacked thyristor protection device of FIG. 6A.

FIG. 6B is a circuit diagram of the stacked thyristor protection device 240 of FIG. 6A. SCR1 is depicted as including a PNP bipolar transistor (Q1) and an NPN bipolar transistor (Q2). Additionally, RSCR is depicted as including a PNP bipolar transistor (Q3), an NPN bipolar transistor (Q4), a first NW resistance (Rnw1), a second NW resistance (Rnw2), a first PW resistance (Rpw1), and a second PW resistance Rpw2. Furthermore, SCR2 is depicted as including a PNP bipolar transistor (Q1') and an NPN bipolar transistor (Q5). Additionally, SCR3 is depicted as including a PNP bipolar transistor (Q1") and an NPN bipolar transistor (Q6) and a resistor corresponding to a resistance of PSUB 74.

With reference to FIGS. 6A and 6B, in an off or low current state, the anode (AN and AP) and cathode (CN and CP) of the RSCR is connected through well resistances Rnw1, Rnw2, Rpw1, and Rpw2. When the current is sufficiently high to turn on the emitter-base junctions of Q3 and Q4, the thyristor path through AP to CN is activated.

During trigger state of the series combination of SCR1 and RSCR, the current is too low to generate significant voltage drop on the RSCR, and thus the trigger voltage is predominately determined by SCR1.

However, when the current level reaches the holding state, the current is sufficiently high to sustain conductivity modulation of SCR1 as well as conductivity modulation in RSCR, since SCR1 and RSCR have a same doping profile of semiconductor wells (for instance, arising from a common doping step(s) during fabrication). Thus, in holding the state, the overall holding voltage corresponds to a sum of voltage drops of SCR1 and RSCR.

The stacked thyristor protection device 240 advantageously also includes SCR2 and SCR3, which activate when current through SCR1 is sufficiently high to lower the barrier between the NW 86 and PSUB 74. Activation of the SCR2 and/or SCR3 aids in lowering on-resistance and improving the current handling capability of the stacked thyristor protection device 240 during stress conditions.

FIG. 7A is a schematic diagram of a cross section of a stacked thyristor protection device 270 according to another embodiment. In FIG. 7A, a left half of the stacked thyristor protection device 270 is depicted. However, the stacked thyristor protection device 270 is implemented to be substantially symmetric with respect to a right edge of the diagram such that the stacked thyristor protection device 270 includes a corresponding right half.

The stacked thyristor protection device 270 of FIG. 7A is similar to the stacked thyristor protection device 240 of FIG. 6A, except that the stacked thyristor protection device 270 omits the gate structures 95 between the P+ region 81$c$ and the N+ region 82$a$ and between the P+ region 81$a$ and the N+ region 82$c$. Rather isolations regions 93 (for instance, STI regions) are included between these active regions.

By implementing the stacked thyristor protection device 270 in this manner, resistance from AN to TN and TP to CP increases with little to no impact on the SCR1 path from AP to CN. Accordingly, when operating at low current levels (for instance, when SCR1 has triggered and RSCR has not), the voltage drop on the RSCR will be increased as well as the overall holding voltage. Additionally, at high current levels, operation of SCR1, SCR2, SCR3, and RSCR is similar to that of the stacked thyristor protection device 240 of FIG. 6A.

FIG. 7B is a schematic diagram of a cross section of a stacked thyristor protection device 280 according to another embodiment. In FIG. 7B, a left half of the stacked thyristor protection device 280 is depicted. However, the stacked thyristor protection device 280 is implemented to be substantially symmetric with respect to a right edge of the diagram such that the stacked thyristor protection device 280 includes a corresponding right half.

The stacked thyristor protection device 280 of FIG. 7B is similar to the stacked thyristor protection device 270 of FIG. 7A, except that the stacked thyristor protection device 280 reverses the positioning of P+ region 81$b$ and P+ region 81$c$ and reverse the positioning of N+ region 82$b$ and N+ region 82$c$.

Accordingly, CP and TP are swapped or reversed, and TN and AN are swapped or reversed. Thus, AN is located in the SCR path AP to CN, which increases the holding voltage further since AN will increase the base voltage of the parasitic PNP bipolar transistor associated with P+ region 81$a$ (AP), NW 76, and PW 75.

FIG. 8A is one example of simulated current distribution of a stacked thyristor protection device at low current density. FIG. 8B is one example of simulated current distribution of a stacked thyristor protection device at medium current density. FIG. 8C is one example of simulated current distribution of a stacked thyristor protection device at high current density.

With reference to FIGS. 8A-8C, the simulated current distributions represent a quasi-stationary simulation that investigates the behavior of one implementation of the stacked thyristor protection device 240 of FIG. 6A at different current levels. In this example, FIG. 8A depicts a current level of about 10 μA/μm, in which RSCR is behaving as a resistor with Rnw1, Rnw2, Rpw1, and Rpw2 serving as a current path through the RSCR. Additionally, at the current level of about 10 μA/μm, the path through SCR1 begins to trigger. FIG. 8B depicts a current level of about 1 mA/μm, in which the RSCR turns on to activate as a thyristor, which raises the overall holding voltage between I/O and VSS. FIG. 8C depicts a current level of about 20 mA/μm, in which SCR2 and SCR3 have also activated (in addition to SCR1 and RSCR) to provide conduction paths deeper in the substrate.

Figure 9:
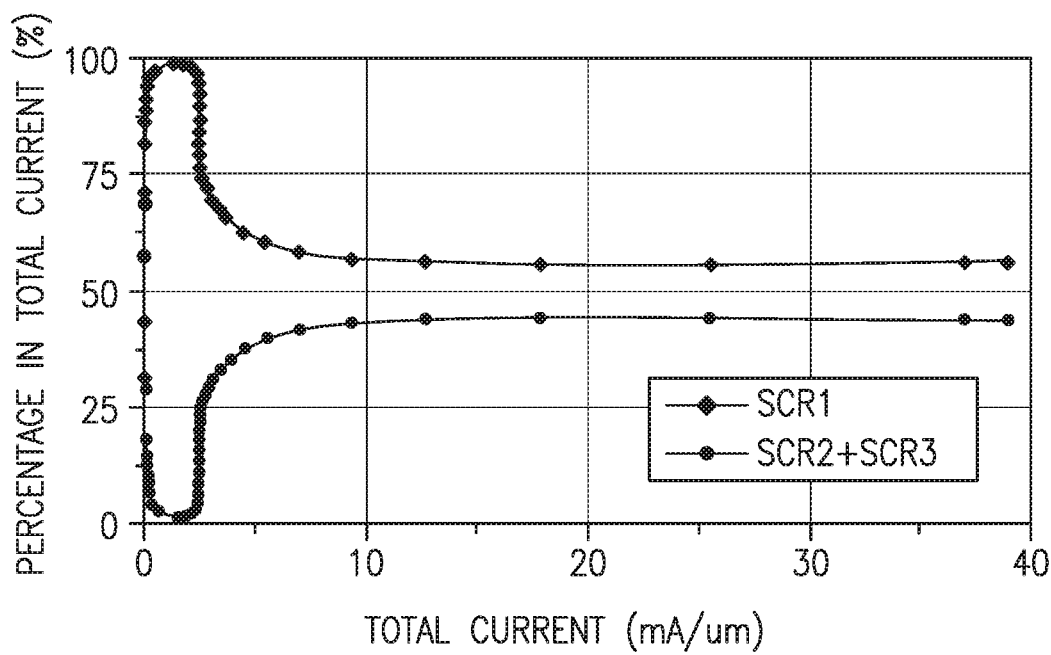
FIG. 9 is one example of a graph of current ratios versus total current for a stacked thyristor protection device.

FIG. 9 is one example of a graph of current ratios versus total current for a stacked thyristor protection device.

The ratio of current through path SCR1 and SCR2+SCR3 are extracted from simulation and plotted. SCR2 and SCR3 only conduct current at high current-levels, which prevents a negative impact on the trigger characteristics of SCR1. In addition, with multiple current paths, the overall robustness is improved.

Figure 10:
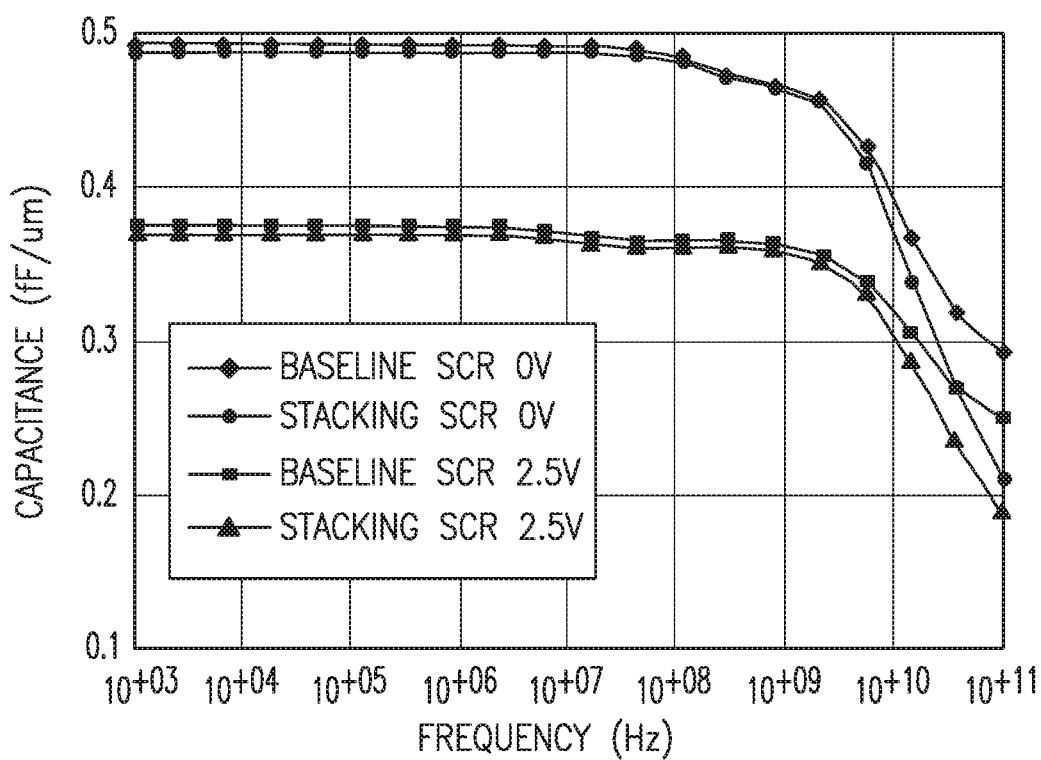
FIG. 10 is one example of a graph of capacitance versus frequency for various thyristor protection devices.

FIG. 10 is one example of a graph of capacitance versus frequency for various thyristor protection devices. The simulated small signal analysis result is plotted, in which the stacked thyristor protection device shows lower capacitance compared to the baseline thyristor.

Figure 11:
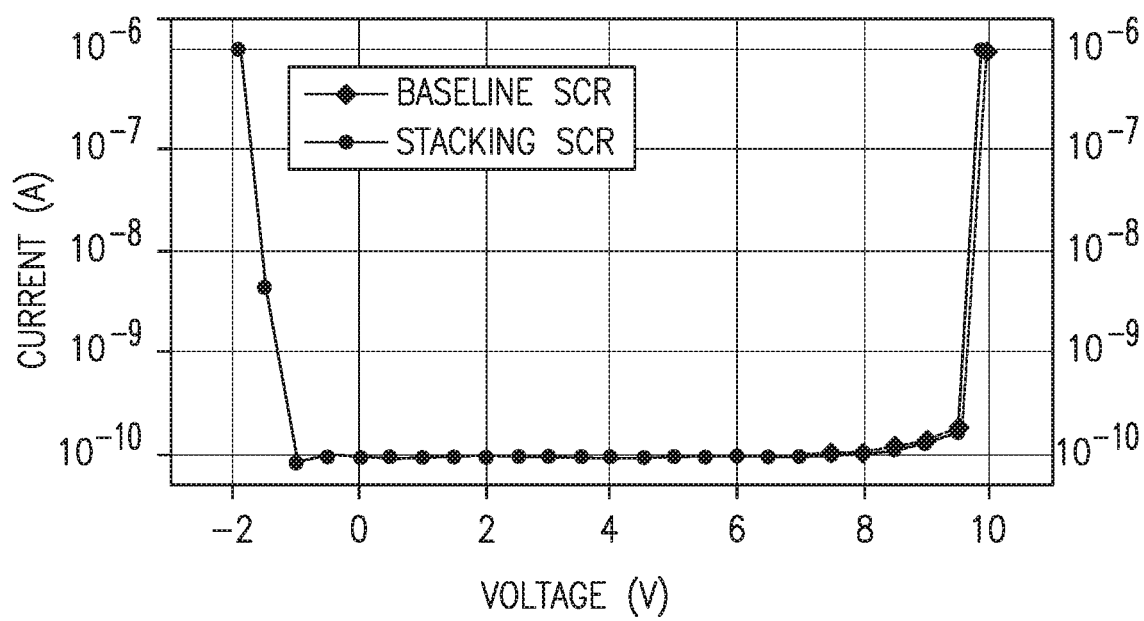
FIG. 11 is one example of a graph of DC current versus DC voltage for various thyristor protection devices.

FIG. 11 is one example of a graph of DC current versus DC voltage for various thyristor protection devices. The DC sweeping results for an implementation in 28 nm CMOS is plotted. The graph demonstrates tolerance to a high voltage condition with no degradation in the breakdown voltage of the stacked thyristor protection device relative to the breakdown voltage of the baseline thyristor.

Figure 12:
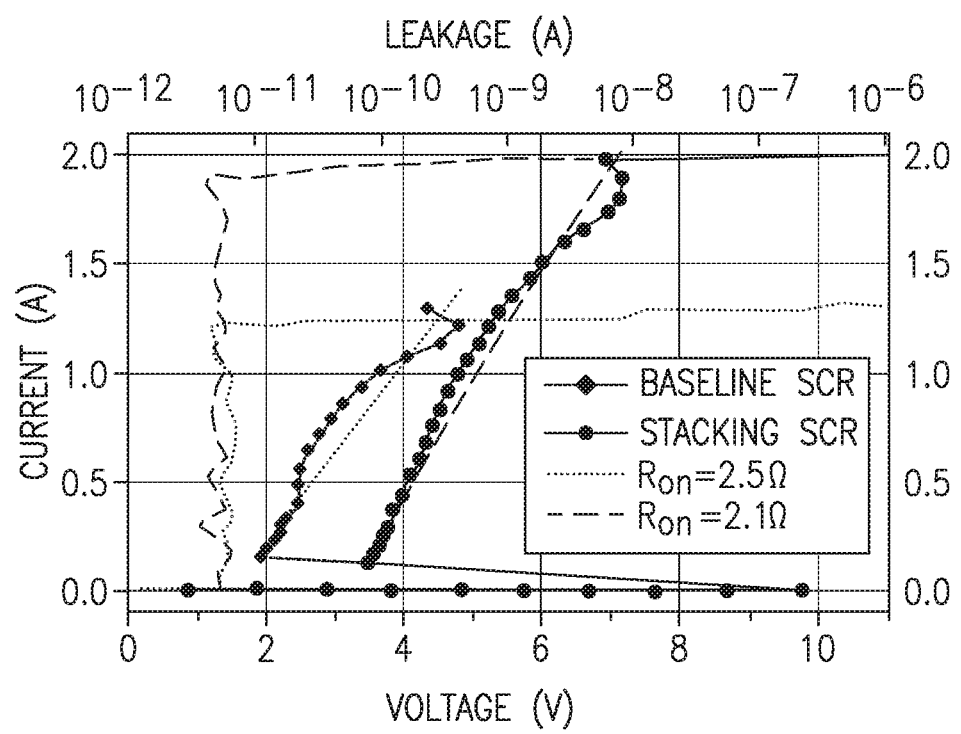
FIG. 12 is one example of a graph of transmission line pulse (TLP) testing for various thyristor protection devices.

FIG. 12 is one example of a graph of transmission line pulse (TLP) testing for various thyristor protection devices.

The TLP characterization is conducted using a 100 ns pulse width with 2 ns rise time. Leakage test condition is set to 3V. The on-resistance Ron is fitted linearly, after the holding point. The baseline thyristor is about 2.5Ω while the stacked thyristor protection device with higher holding voltage is about 2.1Ω. By benefiting from extra current paths provided by SCR2 and SCR3, lower Ron and higher failure current is provided.

Figure 13:
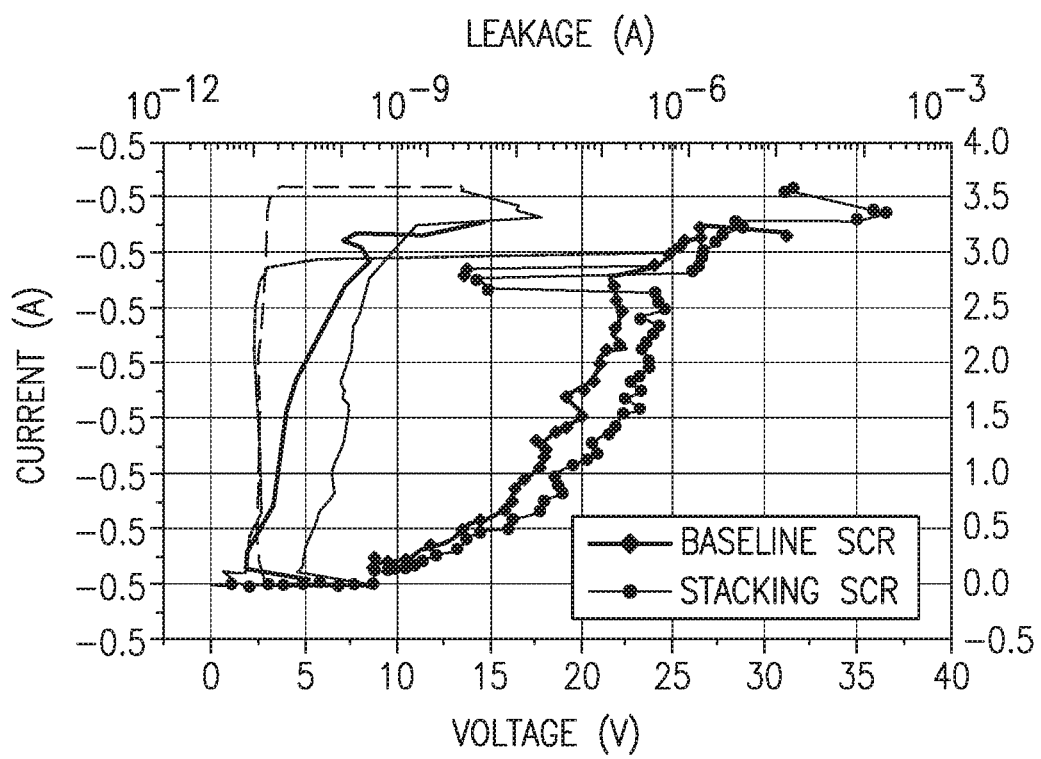
FIG. 13 is one example of a graph of very fast transmission line pulse (VFTLP) testing for various thyristor protection devices.

FIG. 13 is one example of a graph of very fast transmission line pulse (VFTLP) testing for various thyristor protection devices.

The graph depicts a VFTLP test with 10 ns pulse width and 100 ps rising time. As shown in FIG. 13, clamping voltage in the sampling window of the stacked thyristor protection device is higher than that of the baseline SCR, while exhibiting about the same trigger voltage. The failure current level of the stacked thyristor protection device is also higher than the baseline thyristor.

Figure 14:
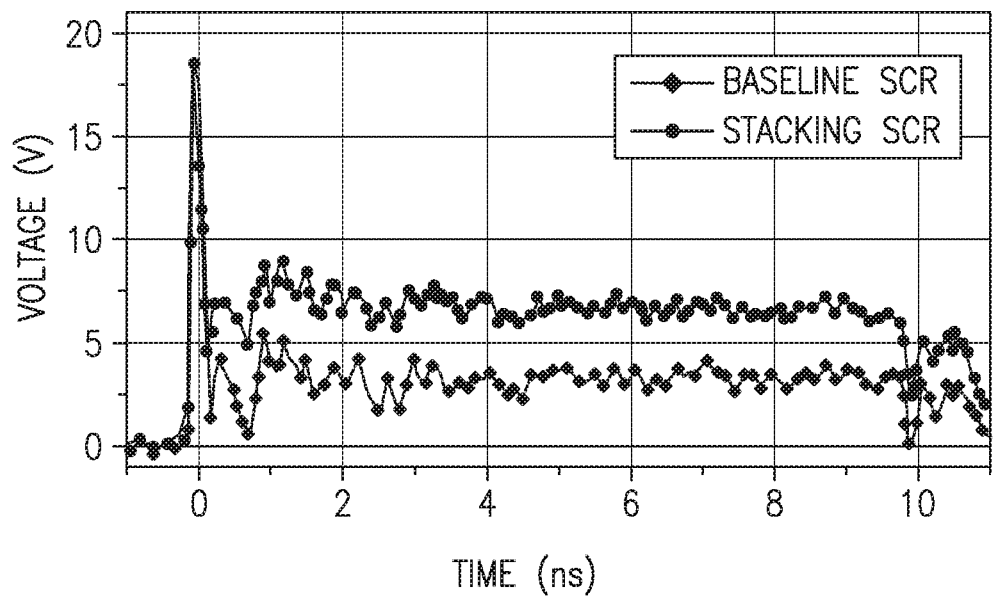
FIG. 14 is one example of a graph of a transient voltage waveform for the VFTLP testing of FIG. 13.

FIG. 14 is one example of a graph of a transient voltage waveform for the VFTLP testing of FIG. 13.

The transient voltage waveform is depicted for a VFTLP test result under 1A VFTLP pulse. As shown in FIG. 14, little to no impact on overshoot voltage occurs when including the RSCR, while holding voltage is enhanced.

Although FIGS. 8A-14 illustrate one example of simulation results for a protection circuit, other simulation results are possible, including results that depend on implementation, application, and/or processing technology.

APPLICATIONS

Devices employing the above-described schemes can be implemented into various electronic devices and multimedia communication systems. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies; and some elements may, be deleted, moved, added, subdivided, combined, and/or modified. Each of these elements may be implemented in a variety of different ways. Any suitable combination of the elements and acts of the various embodiments described above can be combined to provide further embodiments.

What is claimed is:

1. A semiconductor die with high-voltage tolerance and high current handling capability, the semiconductor die comprising:
    a first pad and a second pad;
    a core circuit electrically connected to the first pad; and
    a stacked thyristor protection device configured to protect the core circuit from electrical overstress, the stacked thyristor protection device including a first thyristor and a resistive thyristor electrically connected in a stack between the first pad and the second pad, wherein the first thyristor includes a first PNP bipolar transistor and a first NPN bipolar transistor that are cross-coupled, with a base of the first PNP bipolar transistor connected to a collector of the first NPN bipolar transistor and with a base of the first NPN bipolar transistor connected to a collector of the first PNP bipolar transistor, wherein the resistive thyristor includes a second PNP bipolar transistor and a second NPN bipolar transistor that are cross-coupled, with a base of the second PNP bipolar transistor connected to a collector of second NPN bipolar transistor and with a base of the second NPN bipolar transistor connected to a collector of the second PNP bipolar transistor, and a metal connection directly connecting the collector of the second PNP bipolar transistor and the collector of the second NPN bipolar transistor, and
    wherein an emitter of the first NPN bipolar transistor is connected to an emitter of the second PNP bipolar transistor.

2. The semiconductor die of claim 1, wherein the first thyristor and the resistive thyristor are formed in a monolithic stacked thyristor structure.

3. The semiconductor die of claim 1, wherein the stacked thyristor protection device further includes a first p-type semiconductor well region (PW) configured to operate as the base of the second NPN bipolar transistor, and a first n-type semiconductor well region (NW) adjacent to the first PW and configured to operate as the base of the second PNP bipolar transistor.

4. The semiconductor die of claim 3, wherein the metal connection is configured to bypass a semiconductor interface between the first PW and the first NW.

5. The semiconductor die of claim 3, further comprising a p-type active (P+) region in the first PW and an n-type active (N+) region in the first NW, the electrical connection including a metal conductor connecting the P+ region to the N+ region.

6. The semiconductor die of claim 3, further comprising a P+ cathode region and an N+ cathode region in the first PW and electrically connected to a cathode terminal of the resistive thyristor, and a P+ anode region and an N+ anode region in the first NW and electrically connected to an anode terminal of the resistive thyristor.

7. The semiconductor die of claim 6, further comprising a P+ collector region in the first PW and an N+ collector region in the first NW, the electrical connection including a metal conductor connecting the P+ collector region to the N+ collector region.

8. The semiconductor die of claim 7, further comprising a field plate structure between at least one: (i) the P+ anode region and the N+ anode region; (ii) the P+ cathode region and the N+ cathode region; (iii) the N+ cathode region and the P+ collector region; or (iv) the P+ anode region and the N+ collector region.

9. The semiconductor die of claim 3, wherein the first thyristor includes a P+ anode region formed in a second NW and an N+ cathode region formed in a second PW.

10. The semiconductor die of claim 3, wherein the resistive thyristor includes a low current path through the first NW, the metal connection, and the first PW, and a high current path through a semiconductor interface between the first PW and the first NW.

11. The semiconductor die of claim 1, wherein the first pad is a signal pad and the second pad is a ground pad.

12. A resistive thyristor comprising:
an anode terminal and a cathode terminal;
an n-type semiconductor well region (NW) configured to operate as a base of a PNP bipolar transistor, wherein the NW comprises a p-type active (P+) anode region connected to the anode terminal and configured to operate as an emitter of the PNP bipolar transistor, an n-type active (N+) anode region connected to the anode terminal, and an N+ bypass region;
a p-type semiconductor well region (PW) configured to operate as a base of an NPN bipolar transistor that is cross-coupled to the PNP bipolar transistor with a base of the PNP bipolar transistor connected to a collector of the NPN bipolar transistor and with a base of the NPN bipolar transistor connected to a collector of the PNP bipolar transistor, wherein the PW comprises an N+ cathode region connected to the cathode terminal and configured to operate as an emitter of the NPN bipolar transistor, a P+ cathode terminal connected to the cathode terminal, and a P+ bypass region; and
a metal conductor directly connecting the P+ bypass region to the N+ bypass region such that the collector of the PNP bipolar transistor is connected to the collector of the NPN bipolar transistor.

13. A stacked thyristor protection device for protecting a high data rate interface, the stacked thyristor protection device comprising:

a first thyristor including an anode and a cathode; and
a resistive thyristor including an anode and a cathode, the anode of the resistive thyristor electrically connected to the cathode of the first thyristor,
wherein the resistive thyristor includes a PNP bipolar transistor and a NPN bipolar transistor that are cross-coupled, with a base of the PNP bipolar transistor connected to a collector of NPN bipolar transistor and with a base of the NPN bipolar transistor connected to a collector of the PNP bipolar transistor, and a metal connection directly connecting the collector of the PNP bipolar transistor and the collector of the NPN bipolar transistor.

14. The stacked thyristor protection device of claim 13, further comprising a first p-type semiconductor well region (PW) configured to operate as the base of the NPN bipolar transistor, and a first n-type semiconductor well region (NW) adjacent to the first PW and configured to operate as the base of the PNP bipolar transistor.

15. The stacked thyristor protection device of claim 14, wherein the metal connection is configured to bypass a semiconductor interface between the first PW and the first NW.

16. The stacked thyristor protection device of claim 14, further comprising a p-type active (P+) region in the first PW and an n-type active (N+) region in the first NW, the metal connection connecting the P+ region to the N+ region.

17. The stacked thyristor protection device of claim 16, further comprising a P+ cathode region and an N+ cathode region in the first PW and electrically connected to the cathode of the resistive thyristor, a P+ anode region and an N+ anode region in the first NW and electrically connected to the anode of the resistive thyristor, and a P+ collector region in the first PW and an N+ collector region in the first NW, the metal connection connecting the P+ collector region to the N+ collector region.

18. The stacked thyristor protection device of claim 17, further comprising a field plate structure between at least one: (i) the P+ anode region and the N+ anode region; (ii) the P+ cathode region and the N+ cathode region; (iii) the N+ cathode region and the P+ collector region; or (iv) the P+ anode region and the N+ collector region.

19. The stacked thyristor protection device of claim 14, wherein the first thyristor includes a P+ anode region formed in a second NW and an N+ cathode region formed in a second PW.

20. The stacked thyristor protection device of claim 14, wherein the resistive thyristor includes a low current path through the first NW, the metal connection, and the first PW, and a high current path through a semiconductor interface between the first PW and the first NW.

* * * * *